United States Patent
Altus et al.

(10) Patent No.: US 10,481,187 B2
(45) Date of Patent: Nov. 19, 2019

(54) FREQUENCY SYNTHESIZER OUTPUT CYCLE COUNTER INCLUDING RING ENCODER

(71) Applicant: Texas Instruments Incorporated, Dallas, TX (US)

(72) Inventors: Tom Altus, Plano, TX (US); Karthik Subburaj, Karnataka (IN); Sreekiran Samala, Plano, TX (US); Raghu Ganesan, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 807 days.

(21) Appl. No.: 14/588,014

(22) Filed: Dec. 31, 2014

(65) Prior Publication Data
US 2016/0187401 A1    Jun. 30, 2016

(51) Int. Cl.
| | | |
|---|---|---|
| *G01R 23/02* | (2006.01) | |
| *G01R 23/10* | (2006.01) | |
| *H03L 7/091* | (2006.01) | |

(52) U.S. Cl.
CPC .............. *G01R 23/02* (2013.01); *G01R 23/10* (2013.01); *H03L 7/091* (2013.01)

(58) Field of Classification Search
CPC ....... G01R 23/02; G01R 23/10; H03L 7/0891; H03L 7/087; H03L 7/0814; H03L 7/24; H03L 7/085; H03L 7/091; H03L 7/099; H03L 7/113; H03L 2207/06; H03L 7/18; H03L 2207/50; H03K 5/135; H03K 3/0315; H04L 7/033; G04F 10/005
See application file for complete search history.

(56) References Cited

U.S. PATENT DOCUMENTS

| | | |
|---|---|---|
| 2003/0141936 A1 | 7/2003 | Staszewski et al. |
| 2007/0096836 A1 | 5/2007 | Lee et al. |
| 2008/0315921 A1 | 12/2008 | Cha et al. |
| 2010/0066417 A1 | 3/2010 | Van De Beek |
| 2011/0074514 A1 | 3/2011 | Marutani |

*Primary Examiner* — Sujoy K Kundu
*Assistant Examiner* — L. Anderson
(74) *Attorney, Agent, or Firm* — Brian D. Graham; Charles A. Brill; Frank D. Cimino

(57) ABSTRACT

A method of frequency estimation. A clock output from a frequency synthesizer is received at an input of a ring encoder. The ring encoder generates outputs including a ring encoder output clock and an encoded output which represents LSBs of a clock cycle count of the clock output. A binary counter is run using the ring encoder output clock which provides an output count which represents MSBs of the clock cycle count. Using a reference clock, the encoded output is sampled to provide a sampled encoded output and the output count is sampled to provide a sampled output count. Error correcting is applied to the sampled encoded output to provide a corrected sampled encoded output. The corrected sampled encoded output and sampled output count are combined to provide a combined output which is used for estimating an instantaneous or average frequency of the clock output.

20 Claims, 5 Drawing Sheets

FREQUENCY SYNTHESIZER OUTPUT CYCLE COUNTER INCLUDING RING ENCODER

FIELD

Disclosed embodiments relate to dynamically measuring the frequency of a frequency synthesizer.

BACKGROUND

A frequency synthesizer comprises an electronic system which generates at its output a higher frequency signal(s) from the lower frequency signal provided a single fixed timebase or master oscillator. A common way to implement a frequency synthesizer is with a phase-locked loop (PLL).

A PLL is a feedback control system that includes an error detector (comprising a phase frequency detector coupled to a charge pump) which compares the phases of two input signals (reference signal and frequency divided higher frequency output signal) to produce an error signal that is proportional to the difference between their phases. The error signal is then low pass filtered and used to drive a voltage-controlled oscillator (VCO) which creates a higher output frequency. The output frequency is fed back through a frequency divider to the input of the phase frequency detector, producing a negative feedback loop. If the output frequency drifts, the phase error signal will increase, driving the frequency in the opposite direction so as to reduce the frequency error. Thus the output is locked to the frequency at the other (reference) input of the error detector. This reference input is usually derived from a crystal oscillator, which is very stable in frequency.

One application for frequency synthesizers is for enabling flexible and cost effective implementation of frequency modulated continuous wave (FMCW) radar systems. Automotive radar systems generally use such synthesizers to generate a continuous wave (CW) of constant or time-varying frequency. The most common usage is a linear ramp in frequency (vs. time), commonly called "chirp". For such applications the clock frequency utilized is generally ≥5 GHz.

Any significant deviation from the desired frequency ramp results in a performance degradation which can lead to incorrect estimation of a target's position and/or velocity, inability to separate close targets, or detection of "ghost" targets. Since the user's safety is critical in automotive applications, it is important to continually monitor the frequency error of the frequency synthesizer's output in a continuous wave (CW) manner.

Due to the high clock output frequency generated by frequency synthesizers, to monitor the frequency error of the clock output it is generally necessary to down-sample the clock signal to a lower frequency. After down-sampling, known solutions for monitoring the frequency error of the clock output digitize the down sampled signal, extract the phases, and then differentiate the phases to generate an estimation of the instantaneous or average frequency of the clock output (estimated clock frequency). In addition, measuring the linearity of the synthesizer's output CW from the estimated clock frequency while it is ramping in frequency is typically performed off-line using external equipment.

SUMMARY

This Summary briefly indicates the nature and substance of this Disclosure. It is submitted with the understanding that it will not be used to interpret or limit the scope or meaning of the claims.

Disclosed embodiments estimate the clock frequency for frequency synthesizers allowing the synthesizer frequency error and linearity to be determined. Such embodiments recognize when the frequency synthesizer's clock output is at a frequency of ≥5 GHz conventional binary counters are too slow to be used to measure the frequency CW of the clock output to enable estimating the frequency error CW of the clock output. Accordingly, it is recognized there is a need to find new methods and circuits that allow estimating the frequency synthesizer's output frequency in terms of semiconductor substrate (e.g., silicon) chip area and resolution, and also as an option to find a method to measure frequency ramp linearity on-chip without needing external equipment.

For example, a radar synthesizer generates a clock output comprising a CW of constant frequency or time-varying frequency. The instantaneous clock frequency needs to be accurately determined to know whether the radar synthesizer is performing correctly (i.e., outputting correct frequency) or not. Disclosed embodiments include frequency synthesizer output cycle encoder and counter (OCEC) modules comprising a relatively high speed (HS) ring encoder for encoding the LSBs and a relatively low speed (LS) binary counter running on the lower frequency ring encoder's output clock for the counting the MSBs.

As used herein, a "ring encoder" or an "LSB ring" refers to a plurality of series connected flip-flops and at least one inverter connected cyclically in a ring format, such that the bit pattern reflected at the flip-flops' outputs repeats itself every certain number of clock cycles. The ring encoder receives the frequency synthesizer's clock output (e.g., in one embodiment at a frequency between 19 GHz and 20.25 GHz) and the ring encoder encodes the number of cycles (rising edges) observed on this clock during a predetermined time interval (e.g., 10 ns). A frequency estimator module is provided which has inputs coupled to receive outputs from the ring encoder and the binary counter.

Using a reference clock the frequency estimator performs sampling of the ring encoder state and LS counter state, corrects any errors that may be due to setup or hold violations in the ring encoder sampling, combines the error corrected output with the LS counter sampled output, and uses differentiating or filtering the combined output to estimate the radar synthesizer's instantaneous or average clock frequency. Disclosed OCEC modules provide essentially real-time monitoring of the synthesizer's clock output frequency and frequency ramp linearity which can satisfy a safety requirement such as when used in automotive radar applications, and off-line high-resolution measurement of the frequency ramp linearity for enabling lab measurements/ quality assurance (QA) without needing to use external equipment.

The frequency estimator can use a lower frequency reference clock, such as a sequencer clock (e.g., at 100 MHz) already available on chips having a processor (e.g., central processing unit CPU). When enabled by the sequencer clock, if the difference between the estimated clock output frequency and the expected frequency is above the programmed threshold, an interrupt can be automatically generated to the processor (e.g., CPU). In an off-line mode embodiment, the estimated frequency sequence can be sent as an output to a buffer, where it can be stored and averaged over a plurality of chirps, to provide estimated high-resolution frequency ramp linearity measurements. Alternatively, as noted above, estimated high-resolution frequency ramp linearity measurements can also be monitored in real-time. The OCEC module and the frequency synthesizer can both be formed on the same semiconductor chip.

BRIEF DESCRIPTION OF THE DRAWINGS

Reference will now be made to the accompanying drawings, which are not necessarily drawn to scale, wherein.

DETAILED DESCRIPTION

Figure 1A:
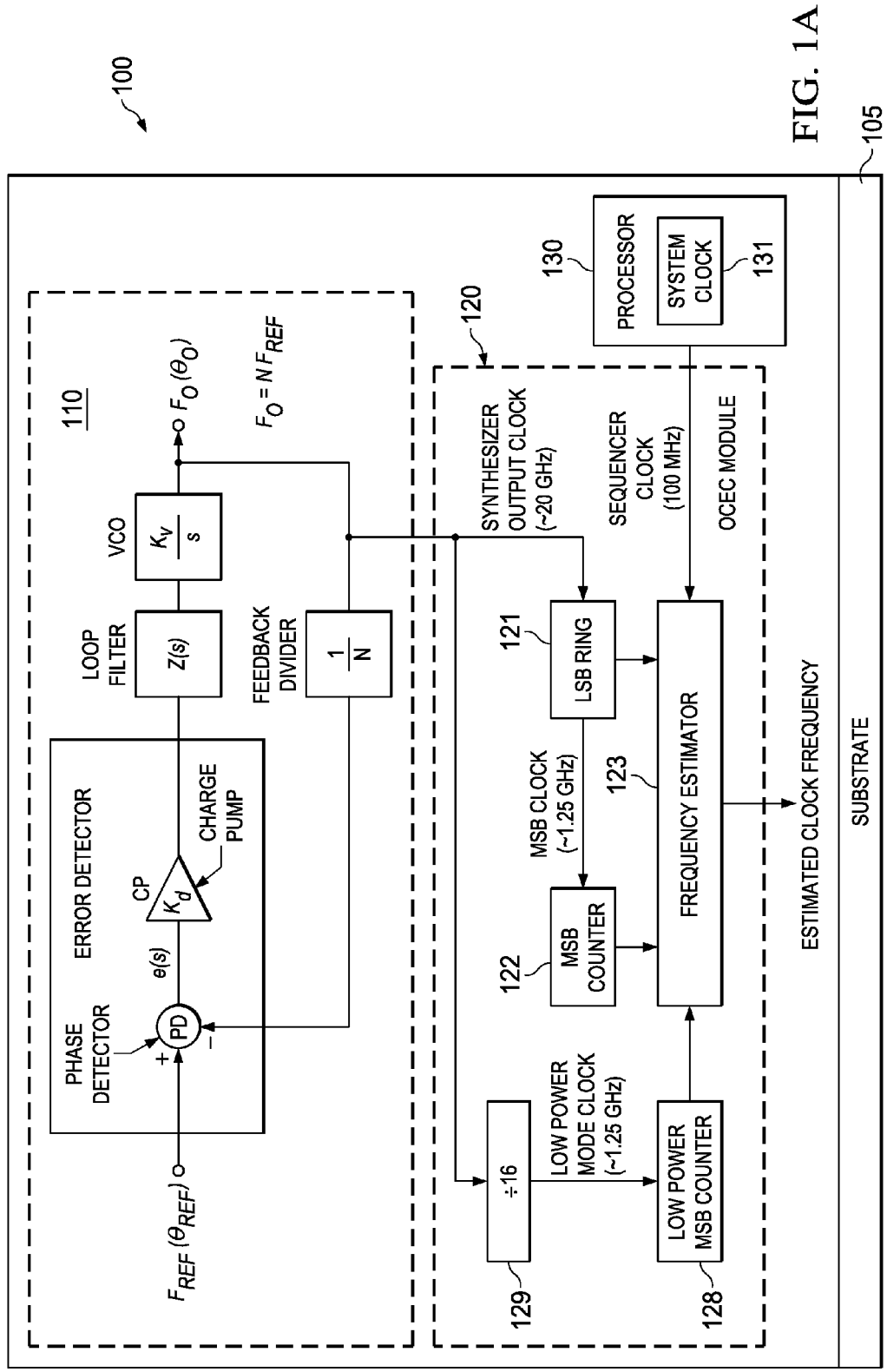
FIG. 1A is a top level block diagram of an example circuit combination including an example disclosed OCEC module coupled to receive the clock output from a frequency synthesizer for generating an estimated clock output frequency, all on a common semiconductor substrate, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed embodiments include methods of frequency estimation and monitoring of the clock output generated by a frequency synthesizer. The clock output from the frequency synthesizer is received at an input of a ring encoder. The ring encoder generates outputs including a ring encoder output clock and an encoded output which represents LSBs of a clock cycle count of the clock output. The binary counter is run using the ring encoder output clock which provides an output count that represents MSBs of the clock cycle count. Using a reference clock, sampling is utilized to obtain a state of the ring encoder to provide a sampled encoded output and a state of the binary counter is sampled to provide a sampled output count. Due to the high frequency of the clock output (e.g., 20 GHz), it is recognized herein there will generally be occasional timing violations which will result in incorrectly sampled bits. Disclosed error correction will correct those incorrect bits, where error correcting is applied to the sampled encoded output to provide a corrected sampled encoded output. The corrected sampled encoded output and sampled output count are combined to provide a combined output which is used for estimating an instantaneous or average frequency of the clock output.

FIG. 1A is a top level block diagram of an example circuit combination 100 including a disclosed OCEC module 120 coupled to receive the clock output generated by a frequency synthesizer 110 which is configured for generating an estimated clock frequency, all on a common semiconductor substrate (or chip) 105 (e.g., silicon substrate), according to an example embodiment. The frequency synthesizer 110 is shown being a PLL-based frequency synthesizer. However, other frequency synthesizer types may also be used.

There are four clock domains shown utilized by OCEC module 120 including a synthesizer output clock (SynClk), a MSB clock (generated internally by the LSB ring encoder shown as an "LSB ring" 121 in FIG. 1A), a low power mode clock (LpClk), and a sequencer clock (SeqClk) shown provided by the system clock 131 associated with the processor 130 on the semiconductor substrate 105. For example, the system clock 131 can be the main digital clock on a system chip that provides a clock for the processor(s) (e.g., CPU) and other circuitry on the chip. The low power mode clock (LpClk) provided to the low power MSB counter 128 is shown utilizing the same frequency as the MSB clock (shown at 1.25 GHz) which is shown implemented by dividing the SynClk from the frequency synthesizer 100 at 20 GHz by 16 which is the length of the LSB ring's 121 pattern cycle, using a clock divider 129 shown as a divide by 16 divider. The output of the low power MSB counter 128 is shown provided to the frequency estimator 123, MSB counter 122 and LSB ring 121.

Low power MSB counter 128 as described in more detail below implements a low power mode which reduces power consumption when lower resolution frequency monitoring can be utilized by shutting down the relatively power hungry LSB ring 121. For example, during low power mode operation, the LSB ring 121, the MSB counter 122 and most of frequency estimator 123' can be shut down.

The LSB ring 121 is shown coupled to receive the SynClk output from the frequency synthesizer 110 shown being at 20 GHz as an example frequency. The LSB ring 121 is shown generating a divided down version of the SynClk output by a factor of 16 to generate the MSB clock shown being at 1.25 GHz, which is coupled to provide the MSB clock to an input of a MSB counter 122 which has an output coupled to a frequency estimator 123. MSB counter 122 by virtue of running at a lower frequency as compared to the LSB ring 121 provides significantly lower power operation per bit processed. The frequency estimator 123 is shown receiving the SeqClk clock, with the SeqClk clock shown being at 100 MHz as an example.

Figure 1B:
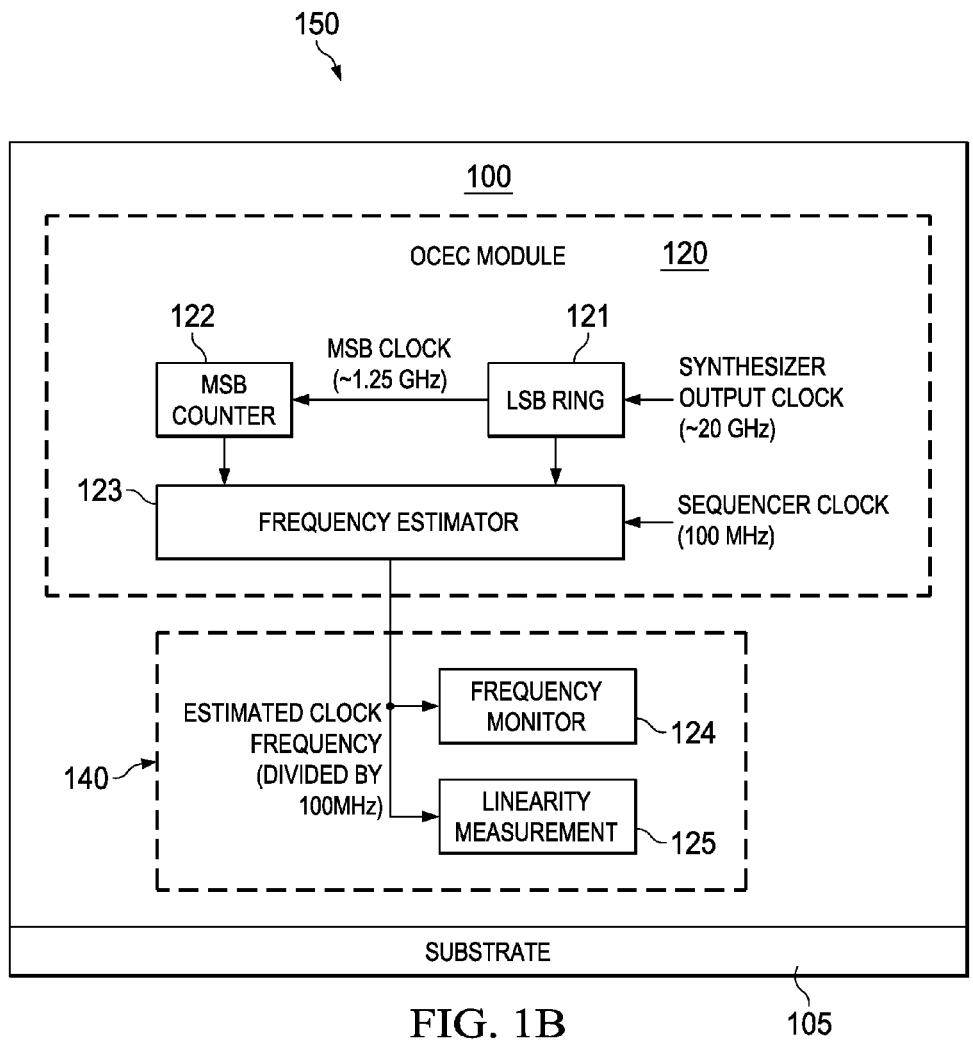
FIG. 1B is a top level block diagram of a circuit combination including an example OCEC module coupled together with estimated clock output frequency signal processing circuitry that receives and processes the estimated clock frequency provided by the frequency estimator, according to an example embodiment.

FIG. 1B is a top level block diagram of a circuit combination 150 including an example OCEC module 120 coupled together with estimated clock frequency processing circuitry 140 that receives and processes the estimated clock frequency provided by the frequency estimator 123, according to an example embodiment. The circuit combination 150 is formed on the common semiconductor substrate 105.

The frequency estimator 123 is shown outputting a number which represents the estimated clock frequency divided by 100 MHz to frequency signal processing circuitry 140 that includes a frequency monitor 124 and linearity measurement block 125 that are both coupled to receive the estimated clock frequency number provided by the frequency estimator 123. Although the linearity measurement block 125 is shown on chip, the linearity measurement block 125 may also be off-chip. The output of the frequency monitor 124 provides a real-time indication of incorrect frequency of the clock output that may be used for safety applications. For example, the output of the frequency monitor 124 may be coupled to an input of a CPU or other processor that can also be on the semiconductor substrate 105, such as processor 130 shown in FIG. 1A. When an error is detected by the frequency monitor 124, in response the processor 130 can indicate to a central safety unit that the frequency synthesizer is malfunctioning.

Figure 2:
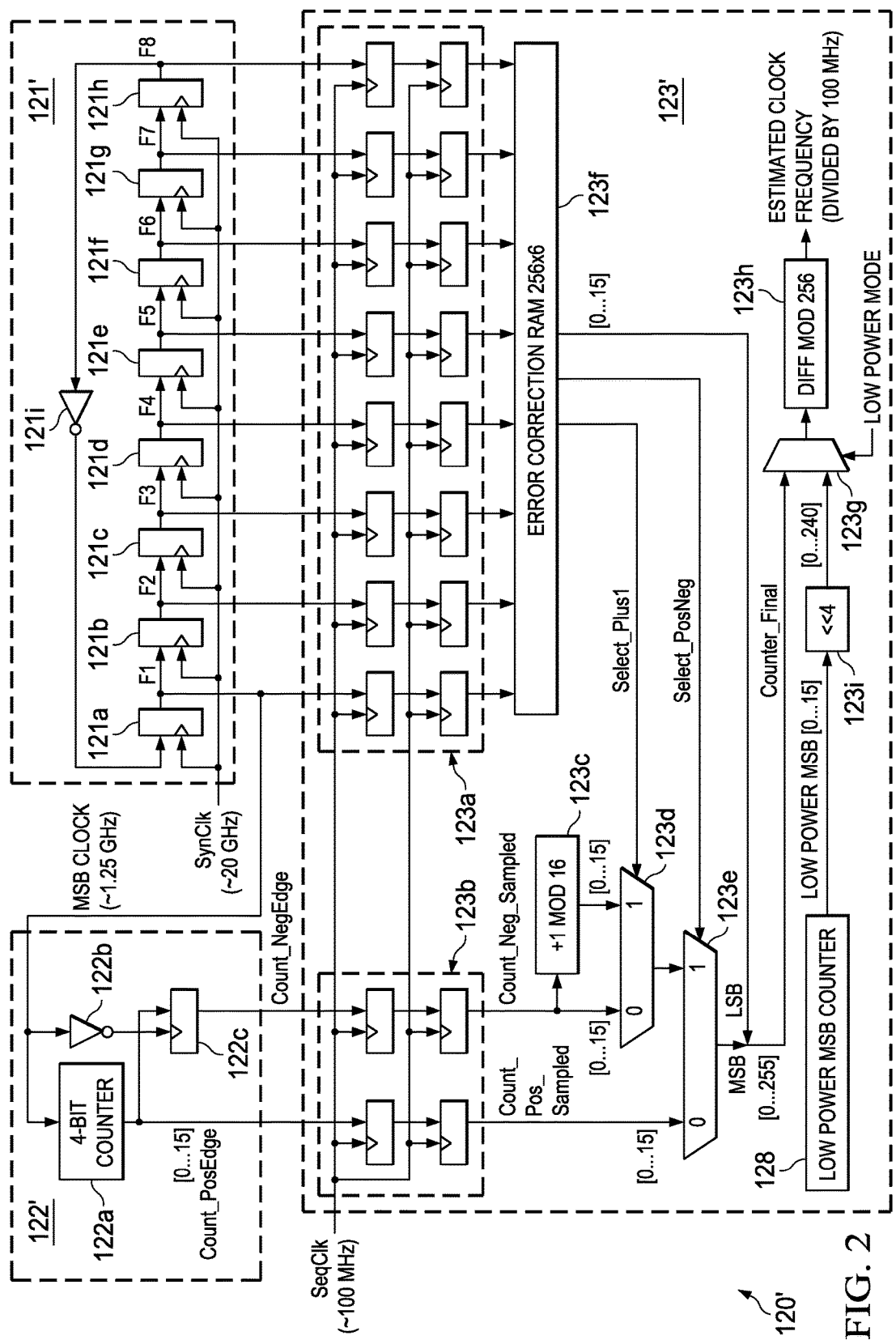
FIG. 2 shown an example OCEC module including realizations for a least significant bits (LSB) ring encoder, most significant bits (MSB) counter and a frequency estimator, according to an example embodiment.

FIG. 2 shows an example OCEC module 120' including example realizations for an LSB ring encoder shown as 121', MSB Counter shown as 122' and frequency estimator shown as 123', according to an example embodiment. The LSB ring 121', MSB Counter 122' and frequency estimator 123' together provide digital-only frequency estimation of the output clock by sampling a relatively high-speed LSB ring 121' running on the synthesizer output clock SynClk and the MSB Counter 122' running on the MSB clock. Using a reference clock shown as the SeqClk, the frequency estimator 123' performs sampling of the ring encoder state (encoded output for the LSBs) and sampling of the MSB counter state to provide a sampled output count, correcting any errors in the sampled encoded output that may be due to setup or hold violations in the ring encoder sampling, combining of the corrected sampled encoded output and sampled output count to provide a combined output, and uses differentiating or filtering the combined output to output an estimated instantaneous or average frequency for the output clock.

LSB ring 121' is shown including eight (8) flip flops as an example number of flip flops, each receiving the 20 GHz SynClk including flip flop 121a providing an output bit F1, 121b providing output bit F2, 121c providing output bit F3, 121d providing output bit F4, 121e providing output bit F5, 121f providing output bit F6, 121g providing output bit F7, and 121h providing output bit F8 that are series connected. There is an inverter 121i connected between the output of flip flop 121h and an input of flip flop 121a to provide a ring. The eight output bits (F1 to F8) from the LSB ring 121' are provided to a cross-clock domain resampler block 123a that has its 8 bit output which provides a sampled encoded output which is coupled to an input of an error correction RAM 123f shown as a 256×6 bits RAM in FIG. 2 as an example. The F1 output provided by flip flop 121a is also used as the MSB clock that is coupled to the MSB Counter 122'.

MSB Counter 122' is shown including a 4-bit binary counter 122a, an inverter 122b and four flip flops 122c. The 4-bit counter 122a counts the number of positive edges of the MSB clock. The output of this 4-bit counter 122a (named Count_PosEdge in FIG. 2) is also sampled on the negative edge of the MSB clock, to provide a half-clock delayed version of it (named Count_NegEdge in FIG. 2).

The frequency estimator 123' includes samplers including a cross-clock domain resampler circuit 123b which receives the output of the 4-bit counter 122a (Count_PosEdge) and provides a first sampled output count (Count_Pos_Sampled), and receives the half-clock delayed version from the four flip flops 122c (Count_NegEdge) and provides a second sampled output count (Count_Neg_Sampled). Adder 123c is shown in FIG. 2 as a +1 modulo 16 adder, which is more generally a modulo $2^n$ adder, where n is the number of bits in the sampled output count, which is coupled to receive the Count_Neg_Sampled signal and in the case of the 1 modulo 16 adder shown functions to add 1 modulo 16.

Frequency estimator 123' is also shown including multiplexers 123d, 123e, and 123g, which function to combine the error corrected output from error corrected sampled encoded output received from the error correction RAM 123f and the sampled output counts received from the MSB Counter 122', as well as a "virtual" shift-left by 4 block 123i. Shift-left by 4 block 123i is "virtual" block because there is no real hardware block involved as the 4 bits simply become the MSBs with zeros as LSBs. Frequency estimator 123' also includes a frequency estimator shown as a "Diff MOD 256" 123h which functions as a differentiator which receives the combined output shown as Counter_Final including the MSBs from multiplexer 123e and LSBs from error correction RAM 123f and outputs the current input minus the previous input ($Y_t=X_t-X_{t-1}$) modulo 256 to provide the estimated clock frequency output shown.

If desired by the user, a low power mode can be enabled. When LOW_POWER_MODE=1 (enabled), most of the blocks of OCEC module 120' are gated off, such as all circuitry shown being shut down except for the low power MSB counter 128, mux 123g and "Diff Mod 256" block 123h of the frequency estimator 123'. The clock for the low power MSB counter 128 is received from the clock divider 129 shown in FIG. 1A, and the low power mode does not need LSB ring 121', MSB Counter 122' or most of the frequency estimator 123' to be powered on.

Figure 3:
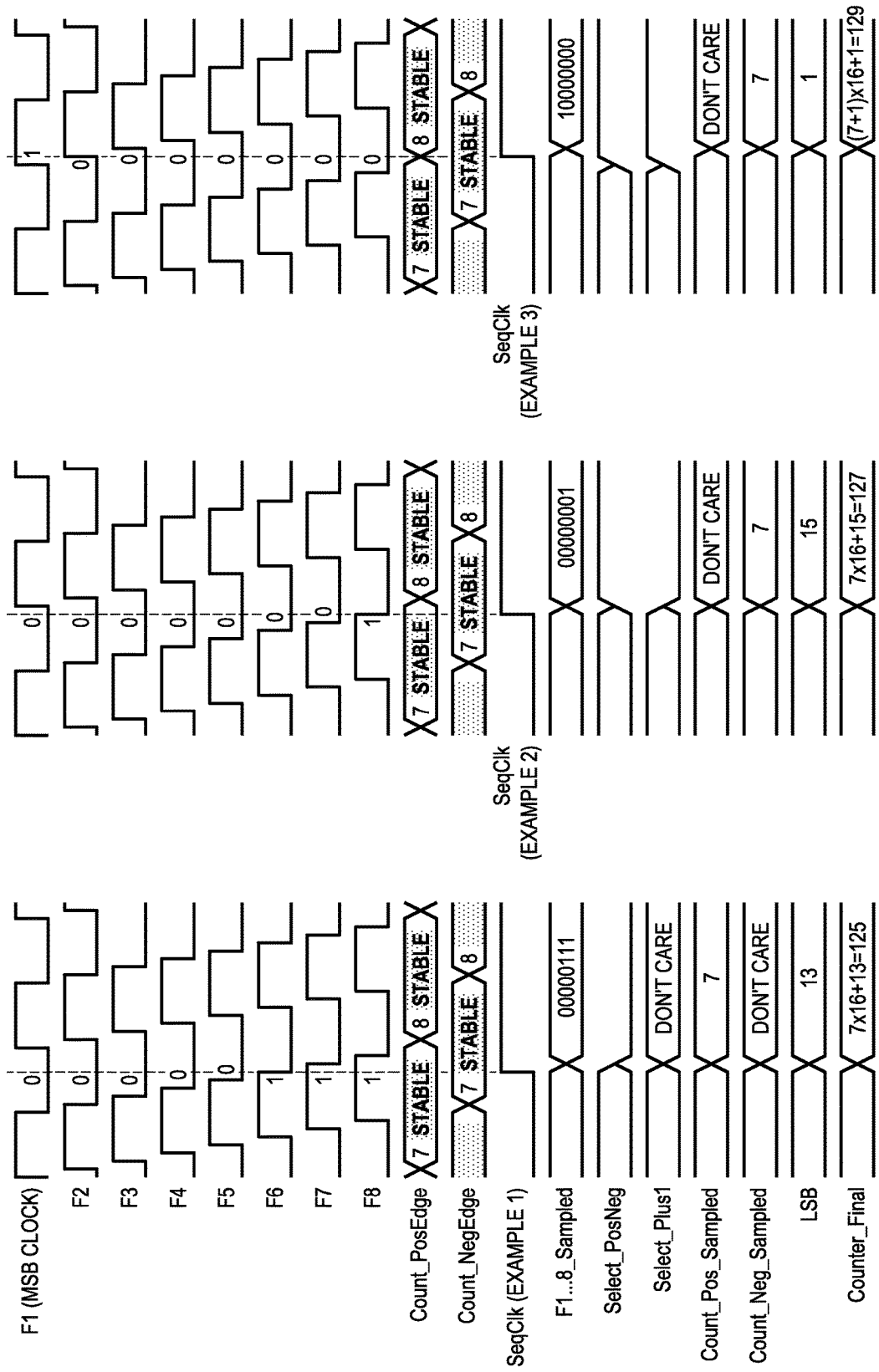
FIG. 3 shows example frequency estimator waveforms, according to an example embodiment.

Regarding how to select the correct MSB value, the frequency estimator waveforms described below relative to FIG. 3 illustrate how the MSB value can be correctly selected from the 3 possible options shown provided in FIG. 2 (Count_Pos_Sampled, Count_Neg_Sampled and Count_Neg_Sampled+1 modulo 16)). The waveforms shown assume all signals coming from SynClk clock domain into the SeqClk clock domain are only sampled once instead of twice, for ease of illustration only. In an actual implementation, per standard Very-large-scale integration (VLSI) design practices, the signals will generally be sampled twice, as described above relative to FIG. 2. Three examples are shown each with example waveforms shown for bits F1 (MSB clock) to F8, as well as waveforms for count_posEdge, count_NegEdge, Seqclk, F1 . . . F8 sampled (which are the inputs to the Error Correction RAM 123f), Select_posNeg, Select_plus1, Count_Pos_sampled, Count_Neg_sampled, LSB and Counter_Final.

The method can choose which MSB value to use (Count_Pos_Sampled or Count_Neg_Sampled) based on the value of one of the LSBs (specifically bit F7 in this particular example in FIG. 3). This ensures that the chosen MSB value was not sampled while its bits were changing, which can result in obtaining an incorrect MSB value.

Regarding LSB error correction, due to violations of setup time or hold time at the ring counter's 121 flip-flops (121a-121h shown in FIG. 2) or at the first SeqClk sampling stage of the frequency estimator 123, the sampled LSBs can generate unexpected values. For this reason there is shown a 256-entry RAM 123f in FIG. 2 which allows a one-to-one mapping from any sampled encoded values to a corresponding programmed binary value stored in RAM 123f.

Figure 4:
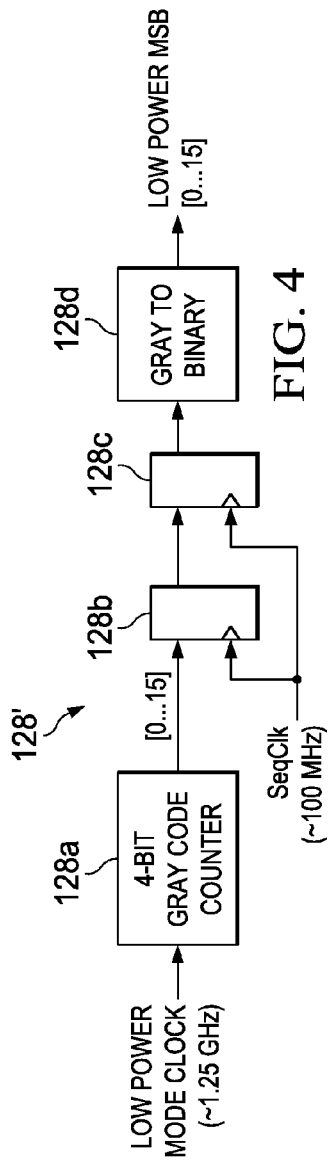
FIG. 4 shows an example lower power mode block diagram, according to an example embodiment.

Regarding operation of the low power MSB counter 128, this block implements a low power mode which provides a low-power alternative to the otherwise relatively high power-consumption when the LSB ring 121 is operating. FIG. 4 shows an example low power MSB counter 128', according to an example embodiment. Low power MSB counter 128' is shown including a 4-bit Gray Code counter 128a that receives the low power mode clock, which generates the 4 MSBs, with the 4 LSBs assumed to be zeros, so the measurement resolution is degraded by a factor of 16. The output of the 4-bit Gray Code counter 128a is resampled twice by flip-flops 128b and 128c, and coupled to a Gray to binary counter 128d which provides a 4-bit low power MSB output. Flip-flops 128b and 128c each receive the SeqClk.

The 4-bit Gray Code counter 128a operates on the LpClk, which is the synthesizer output clock frequency (SynClk of 20 GHz) divided by 16. Using Gray coding ensures that the maximum error at the output of the Gray to binary counter 128d at any time is only 1, thus limiting the measurement error. When LOWPOWERMODE=1 at mux 123g, the LSB ring 121 and most of OCEC module 120 are gated off, thus saving significant power.

Figure 5A:
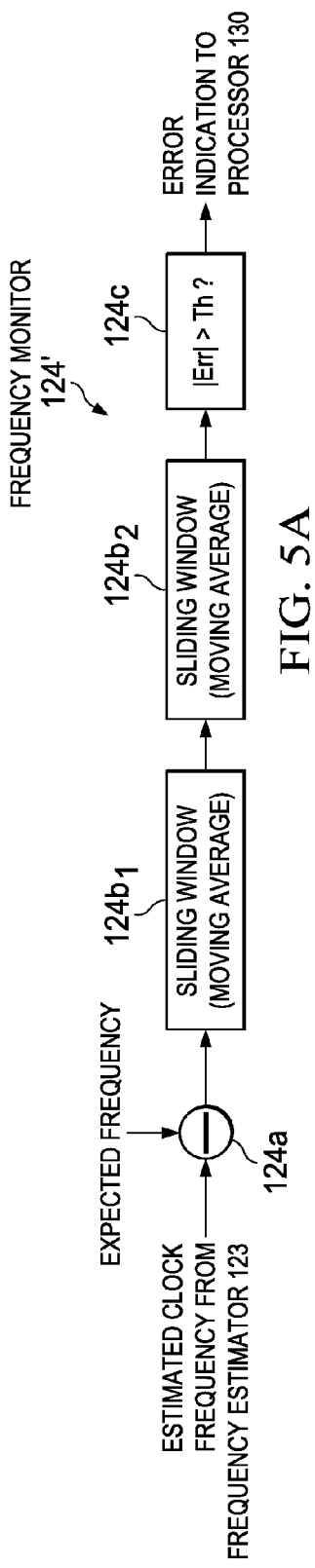
FIG. 5A shows a block diagram for an example frequency monitor, according to an example embodiment.

FIG. 5A shows a block diagram for an example frequency monitor shown as 124', according to an example embodiment. The frequency monitor 124' is enabled during chirp time by a signal from the processor 130. The frequency monitor 124' using appropriate circuitry (not shown) internally generates the expected frequency shown, based on the chirp parameters that are sent from the processor 130 which functions as a sequencer, and using subtracting block 124a subtracts it from the estimated clock frequency generated by the frequency estimator 123. The output of the subtracting block 124a is coupled to a series combination of a first sliding window (moving average) block 124b1 and a second sliding window (moving average) block 124b2. The output of the second sliding window (moving average) block 124b2 is coupled to a comparing block 124c. If the difference between the expected and estimated clock frequencies is larger than the configured threshold shown as "Th" (which can also come from the processor 130 functioning as a sequencer), the error indication signal shown output by the comparing block 124c can be generated which can be used as described above to interrupt to the processor 130 or other processor or hardware component.

Figure 5B:
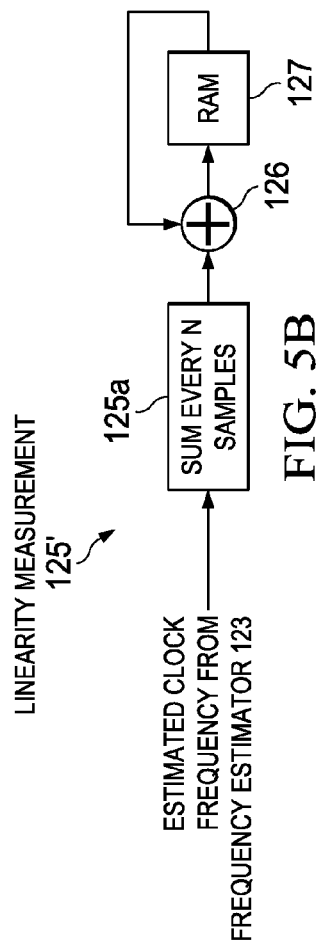
FIG. 5B shown an example real-time/off-line linearity measurement block, according to an example embodiment.

For implementing self-test ramp frequency linearity measurements, an averaging RAM sub-system (SS) can be used. FIG. 5B shows an example real-time/off-line linearity measurement module 125', according to an example embodiment. Linearity measurement module 125' can be on-chip of off-chip. Linearity measurement module 125' is shown including a summing block 125a that receives the estimated clock frequency generated by the frequency estimator 123 and has its output coupled to an input of an adder 126, such as a 32-bit adder. The output of the adder is coupled to an input of the RAM 127, which feeds back its output to another input of the adder 126. This feedback path can be used to average a plurality of similar chirps to improve the measurement precision. After averaging, the RAM entries can be read by software and processed further to assess the quality of the frequency ramp's linearity.

Disclosed embodiments thus provide an on-chip method which can be used to continuously estimate and monitor the frequency synthesizer output frequency in real-time to detect performance issues essentially immediately, and measure the frequency synthesizer's linearity when ramping in frequency, in off-line or real-time mode without needing any external equipment. As described above, disclosed embodiments are generally applicable to all frequency synthesizers and PLLs, not restricted to radar applications.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of frequency estimation, the method comprising:
   receiving, at an input of a ring encoder from a frequency synthesizer, a clock output, wherein the ring encoder comprises a plurality of flip flops connected in series and at least one inverter coupled between a last flip flop of the plurality of flip flops and a first flip flop of the plurality of flip flops;
   generating, by the ring encoder, a ring encoder output clock based on the clock output, wherein a frequency of the clock output is an integer multiple of a frequency of the ring encoder output clock;
   generating, by the ring encoder, an encoded output based on the clock output, wherein the encoded output indicates least significant bits (LSBs) of a clock cycle count of the clock output;
   generating, by a binary counter, based on the ring encoder output clock, an output count which indicates most significant bits (MSBs) of the clock cycle count;
   sampling, by a frequency estimator, using a reference clock, the encoded output, to provide a sampled encoded output; and
   sampling, by the frequency estimator, using the reference clock, the output count, to provide a sampled output count.

2. The method of claim 1, further comprising:
   error correcting, by the frequency estimator, the sampled encoded output, to provide a corrected sampled encoded output;
   combining, by the frequency estimator, the corrected sampled encoded output and the sampled output count, to provide a combined output; and
   estimating, by the frequency estimator, using the combined output, an instantaneous or average frequency of the clock output, to provide an estimated clock frequency.

3. The method of claim 2, wherein the error correcting comprises one-to-one mapping using a random access memory (RAM).

4. The method of claim 2, wherein estimating the instantaneous or average frequency of the clock output comprises differentiating the combined output.

5. The method of claim 2, further comprising:
   determining a frequency error of the clock output by comparing the estimated clock frequency to an expected frequency; and
   sending an error indication signal in response to determining that the frequency error is greater than a predetermined threshold.

6. The method of claim 2, wherein sampling the output count comprises:
   generating a plurality of different sampled output count options; and
   selecting one of the plurality of different sampled output count options.

7. The method of claim 6, wherein sampling the output count includes:
   sampling exclusively by the reference clock, to provide a first sampled output count option;
   sampling by a negative edge of the ring encoder output clock by the reference clock, to provide a second sampled output count option; and
   sampling by the negative edge of the ring encoder output clock by the reference clock incremented by a 1 modulo $2^n$ adder, to provide a third sampled output count option, and wherein selecting one of the plurality of different sampled output count options is based on the corrected sampled encoded output.

8. The method of claim 2, wherein the clock output is at a frequency of at least 5 GHz.

9. The method of claim 2, further comprising:
sending the estimated clock frequency to a buffer for storage; and
averaging the estimated clock frequency over a plurality of chirps, to provide an estimated frequency ramp linearity measurement.

10. The method of claim 1, further comprising in a low power mode:
shutting down the ring encoder, the binary counter, and the frequency estimator
determining, by a Gray code counter, based on the ring encoder output clock, an estimated clock frequency.

11. A circuit, comprising:
a ring encoder having an input coupled to receive a clock output from a frequency synthesizer, the ring encoder comprising a plurality of flip flops connected in series and at least one inverter coupled between a last flip flop of the plurality of flip flops and a first flip flop of the plurality of flip flops, the ring encoder configured to:
generate a ring encoder output clock based on the clock output, wherein a frequency of the clock output is an integer multiple of a frequency of the ring encoder output clock; and
generate an encoded output based on the clock output, wherein the encoded output indicates least significant bits (LSBs) of a clock cycle count of the clock output;
a binary counter having an input coupled to receive the ring encoder, wherein the binary counter is configured to, based on the ring encoder output clock generate an output count indicating most significant bits (MSBs) of the clock cycle count; and
a frequency estimator coupled to the ring encoder and to the binary counter, the frequency estimator configured to:
sample, using a reference clock, the encoded output, to provide a sampled encoded output; and
sample the output count, to provide a sampled output count.

12. The circuit of claim 11, further comprising a Gray code counter for implementing a low power mode, the Gray code counter coupled to the ring encoder for shutting down the ring encoder, and the binary counter, wherein the Gray code counter is configured to estimate a clock frequency exclusively.

13. The circuit of claim 11, wherein the frequency estimator is configured to:
error correct the sampled encoded output, to provide a corrected sampled encoded output;
combine the corrected sampled encoded output and the sampled output count, to provide a combined output; and
estimate, using the combined output, an instantaneous or average frequency of the clock output, to generate an estimated clock frequency.

14. The circuit of claim 13, wherein the frequency estimator comprises a frequency monitor configured to:
receive the estimated clock frequency; and
compare the estimated clock frequency to an expected clock frequency, to provide an error indication in response to determining that a difference between the estimated clock frequency and the expected clock frequency is greater than a predetermined threshold, the circuit further comprising a processor coupled to receive the error indication, wherein the circuit is disposed on a semiconductor substrate.

15. The circuit of claim 13, wherein the frequency estimator comprises a random access memory (RAM) that implements one-to-one mapping for error correcting the sampled encoded output, to provide the corrected sampled encoded output.

16. The circuit of claim 13, wherein the frequency estimator comprises a differentiator for differentiating the combined output.

17. The circuit of claim 13, wherein sampling the output count comprises generating a plurality of different sampled output count options and selecting one of the plurality of different sampled output count options.

18. The circuit of claim 17, wherein sampling the output count includes:
sampling exclusively by the reference clock, to provide a first sampled output count option;
sampling by a negative edge of the ring encoder output clock by the reference clock, to provide a second sampled output count option; and
sampling by a negative edge of said ring encoder output clock by the reference clock, incremented by a 1 modulo $2^n$ adder, to provide a third sampled output count option, and wherein selecting one of the plurality of different sampled output count options is based on the corrected sampled encoded output.

19. The circuit of claim 13, wherein the clock output is at a frequency of ≥5 GHz.

20. The circuit of claim 13, further comprising a linearity measurement module coupled to receive the estimated clock frequency, the linearity measurement module comprising a summing block that receives the estimated clock frequency, wherein an output of an adder is coupled to an input of a random access memory (RAM).

* * * * *